US011621304B2

(12) United States Patent
Duan

(10) Patent No.: US 11,621,304 B2
(45) Date of Patent: Apr. 4, 2023

(54) DISPLAY PANEL WITH SINGLE CRYSTAL PEROVSKITE COLOR CONVERSION LAYER AND MANUFACTURING METHOD THEREOF

(71) Applicant: Shenzhen China Star Optoelectronics Semiconductor Display Technology Co., Ltd., Shenzhen (CN)

(72) Inventor: Miao Duan, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/646,154

(22) PCT Filed: Jan. 16, 2020

(86) PCT No.: PCT/CN2020/072408
§ 371 (c)(1),
(2) Date: Mar. 11, 2020

(87) PCT Pub. No.: WO2021/138930
PCT Pub. Date: Jul. 15, 2021

(65) Prior Publication Data

US 2022/0328565 A1 Oct. 13, 2022

(30) Foreign Application Priority Data

Jan. 6, 2020 (CN) ........................ 202010009433.9

(51) Int. Cl.
*H01L 27/32* (2006.01)
*H01L 51/52* (2006.01)
*H01L 51/56* (2006.01)

(52) U.S. Cl.
CPC ........ *H01L 27/322* (2013.01); *H01L 27/3246* (2013.01); *H01L 51/5284* (2013.01); *H01L 51/56* (2013.01); *H01L 2227/323* (2013.01)

(58) Field of Classification Search
USPC ........................................................... 257/40
See application file for complete search history.

(56) References Cited

U.S. PATENT DOCUMENTS

2017/0279082 A1 9/2017 Grabowski et al.
2019/0086799 A1* 3/2019 Li ............................ G03F 7/16
(Continued)

FOREIGN PATENT DOCUMENTS

CN 106783922 A 5/2017
CN 106876432 A 6/2017
(Continued)

*Primary Examiner* — Nduka E Ojeh
(74) *Attorney, Agent, or Firm* — PV IP PC; Wei Te Chung; Ude Lu

(57) ABSTRACT

The present disclosure provides a display panel and a manufacturing method thereof. The display panel includes a first substrate, a second substrate, a blue light emitting layer, and a single crystal perovskite color conversion layer. The single crystal perovskite color conversion layer includes red light single crystal perovskite units disposed on red subpixel areas and green light single crystal perovskite units disposed on green subpixel areas. The red light single crystal perovskite units receive blue light to emit red light, and the green light single crystal perovskite units receive blue light to emit green light.

18 Claims, 2 Drawing Sheets

100

10a 10b 10c
10 12 14 15 13
R G B
111 11 112 14a
23 21 22 20

(56) References Cited

U.S. PATENT DOCUMENTS

2020/0035755 A1* 1/2020 Zhou .................... G06F 3/011
2020/0075814 A1* 3/2020 Park .................... H01L 25/0753
2020/0081292 A1* 3/2020 Park .................... G02F 1/133514

FOREIGN PATENT DOCUMENTS

CN 106910836 A 6/2017
CN 108957832 A 12/2018
CN 109324435 A 2/2019

* cited by examiner

Figure 3:
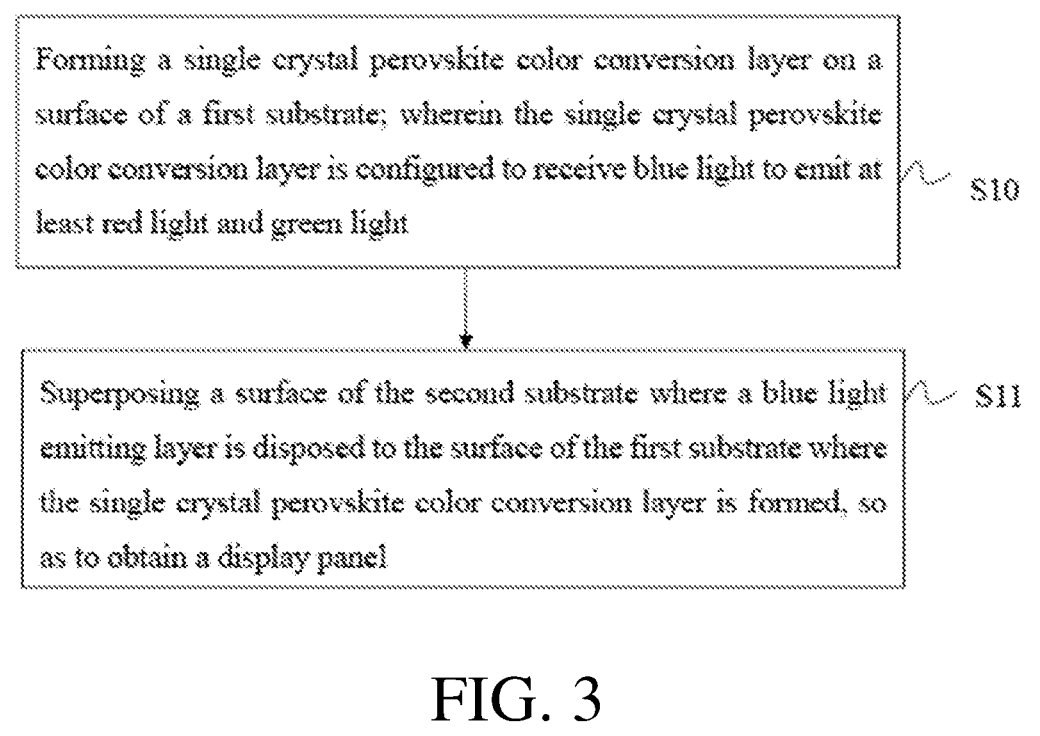

Forming a single crystal perovskite color conversion layer on a surface of a first substrate; wherein the single crystal perovskite color conversion layer is configured to receive blue light to emit at least red light and green light

S10

Superposing a surface of the second substrate where a blue light emitting layer is disposed to the surface of the first substrate where the single crystal perovskite color conversion layer is formed, so as to obtain a display panel

DISPLAY PANEL WITH SINGLE CRYSTAL PEROVSKITE COLOR CONVERSION LAYER AND MANUFACTURING METHOD THEREOF

FIELD OF INVENTION

The present disclosure relates to the field of display technologies, and particularly, relates to a display panel and a manufacturing method of the display panel.

BACKGROUND OF INVENTION

Organic light emitting diode displays have advantages of self-light emission, fast response speed, wide viewing angles, and low power consumption, which make organic light emitting diode displays widely used in mobile phones and tablet computers. However, conventional organic light emitting diode displays have a problem that color gamut is not wide enough.

Therefore, it is necessary to propose a technical solution to improve the color gamut of an organic light emitting diode display.

Technical Problems

The present disclosure aims to provide a display panel and a manufacturing method of the display panel. The display panel has the advantage of wide color gamut.

Technical Solutions

In order to achieve the above purposes, the present disclosure provides a manufacturing method of a display panel, the manufacturing method of the display panel includes following steps:

forming a single crystal perovskite color conversion layer on a surface of a first substrate; wherein the single crystal perovskite color conversion layer is configured to receive blue light to emit at least red light and green light; and superposing a surface of the second substrate where a blue light emitting layer is disposed to the surface of the first substrate where the single crystal perovskite color conversion layer is formed, so as to obtain the display panel; wherein the blue light emitting layer is configured to emit the blue light.

In the above manufacturing method of the display panel, the step of forming a single crystal perovskite color conversion layer on a surface of a first substrate includes following steps:

adding perovskite precursor solution having a predetermined concentration to pixel grooves and heating the perovskite precursor solution until perovskite seed crystals are formed; wherein the first substrate is provided with the pixel grooves; and sequentially adding saturated perovskite precursor solution to the pixel grooves where the perovskite seed crystals are formed, heating and holding until single crystal perovskite appears, stopping heating and removing solvent in the perovskite precursor solution, so as to obtain the single crystal perovskite color conversion layer;

wherein the predetermined concentration is less than a concentration of the saturated perovskite precursor solution.

In the above manufacturing method of the display panel, the perovskite precursor solution with the predetermined concentration and the saturated perovskite precursor solution are added to the pixel grooves by inkjet printing, viscosities of the perovskite precursor solution with the predetermined concentration and the saturated perovskite precursor solution range from 1 cps to30 cps.

In the above manufacturing method of the display panel, the predetermined concentration ranges from 1.0 mol/L to 2.0 mol/L.

In the above manufacturing method of the display panel, a temperature for heating to form the perovskite seed crystals is 80° C.-100° C., and a temperature for heating and holding is 80° C.-100° C.

In the above manufacturing method of the display panel, the temperature for heating to form the perovskite seed crystals is 8° C.-12° C. lower than the temperature for heating and holding.

In the above manufacturing method of the display panel, the perovskite precursor solution includes component A, component B, and a solvent, the component A is selected from at least one of $PbBr_2$, $PbI_2$, and $PbCl_2$, the component B is selected from at least one of $CH_3NH_3Br$ and CsBr, and the solvent is selected from at least one of dimethylformamide and dimethyl sulfoxide.

In the above manufacturing method of the display panel, the blue light emitting layer includes a plurality of blue light emitting units, the blue emitting unit includes at least one of a blue organic light emitting diode, a blue light emitting diode, a blue mini-LED, a blue micro-LED, and a blue quantum dot.

A display panel includes a first substrate, a second substrate, a blue light emitting layer, and a single crystal perovskite color conversion layer, the second substrate is disposed opposite to the first substrate;

the blue light emitting layer is disposed on a surface of the second substrate opposite to the first substrate, and the blue light emitting layer is configured to emit blue light;

the single crystal perovskite color conversion layer is disposed on a surface of the first substrate opposite to the second substrate, and the single crystal perovskite color conversion layer includes red light single crystal perovskite units disposed on red subpixel areas and green light single crystal perovskite units disposed on green subpixel areas, the red light single crystal perovskite units receive the blue light to emit red light, the green light single crystal perovskite units receive the blue light to emit green light, the first substrate defines the red subpixel areas, the green subpixel areas, and the blue subpixel areas thereon.

In the above display panel, the single crystal perovskite color conversion layer further includes blue light single crystal perovskite units disposed on the blue subpixel areas, the blue light single crystal perovskite units receive the blue light emitted by the blue light emitting layer and are excited to emit another blue light; and color purity of the blue light emitted by the blue single crystal perovskite upon excitation is greater than or equal to color purity of the blue light emitted by the blue light emitting layer.

In the above display panel, the red light single crystal perovskite unit includes at least one of a single crystal of $CH_3NH_3Pb(Br/I)_3$ and a single crystal of $CsPb(Br/I)_3$, the green light single crystal perovskite unit includes at least one of a single crystal of $Cs_4PbBr_6$, a single crystal of $CsPbBr_3$, and a single crystal of $CH_3NH_3PbBr_3$, and the blue light single crystal perovskite unit includes at least one of a single crystal of $Cs_3Cu_2I_5$, a single crystal of $CH_3NH_3Pb(Br/Cl)_3$, and a single crystal of $CsPb(Br/Cl)_3$.

In the above display panel, a pixel definition layer is disposed on the surface of the first substrate opposite to the second substrate, a plurality of openings are defined in the pixel definition layer, and each of the openings defines a subpixel area; three adjacent openings respectively define as the red subpixel area, the blue subpixel area, and the green subpixel area; the red light single crystal perovskite units are disposed in the openings of the pixel definition layer corresponding to the red subpixel areas, and the green light single crystal perovskite units are disposed in the openings of the pixel definition layer corresponding to the green subpixel areas.

In the above display panel, the pixel definition layer is a black organic photoresist layer.

In the above display panel, the display panel further includes a color filter layer and a black matrix layer; the color filter layer is disposed between the pixel definition layer and the first substrate, the color filter layer includes a plurality of filter units, the plurality of filter units includes red filter units, green filter units, and blue filter units arranged at intervals; the black matrix layer includes a plurality of black matrixes arranged in array, and there is a black matrix disposed between two adjacent filter units.

In the above display panel, a barrier layer is disposed between the pixel definition layer and the color filter layer, and the barrier layer is configured to block water and oxygen.

In the above display panel, the blue light emitting layer includes a plurality of blue light emitting units, the blue emitting unit includes at least one of a blue organic light emitting diode, a blue light emitting diode, a blue mini-LED, a blue micro-LED, and a blue quantum dot.

Beneficial Effects

The present disclosure provides a display panel and a manufacturing method thereof. The display panel includes a first substrate, a second substrate, a blue light emitting layer, and a single crystal perovskite color conversion layer. The first substrate and the second substrate are opposite to each other. The blue light emitting layer is disposed on a surface of the second substrate opposite to the first substrate, and the blue light emitting layer is configured to emit blue light. The single crystal perovskite color conversion layer is disposed on a surface of the first substrate opposite to the second substrate, and the single crystal perovskite color conversion layer includes red light single crystal perovskite units disposed on red subpixel areas and green light single crystal perovskite units disposed on green subpixel areas, the red light single crystal perovskite units receive the blue light to emit red light, the green light single crystal perovskite units receive the blue light to emit green light. The first substrate defines the red subpixel areas, the green subpixel areas, and the blue subpixel areas thereon. Since the single crystal perovskite color conversion layer is excited by blue light to emits red light and green light, thereby widing the color gamut of the display panel. In addition, compared with polycrystalline perovskite, the single crystal perovskite has lower defect density and longer carrier migration distance, which can improve stability of the single crystal perovskite color conversion layer.

DESCRIPTION OF DRAWINGS

FIG. 3 is a process diagram of a manufacturing method of a display panel according to an embodiment of the present disclosure.

DETAILED DESCRIPTION OF EMBODIMENTS

The technical solutions in the embodiments of the present disclosure will be clearly and completely described with reference to the accompanying drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative work fall into the protection scope of the present disclosure.

Figure 1:
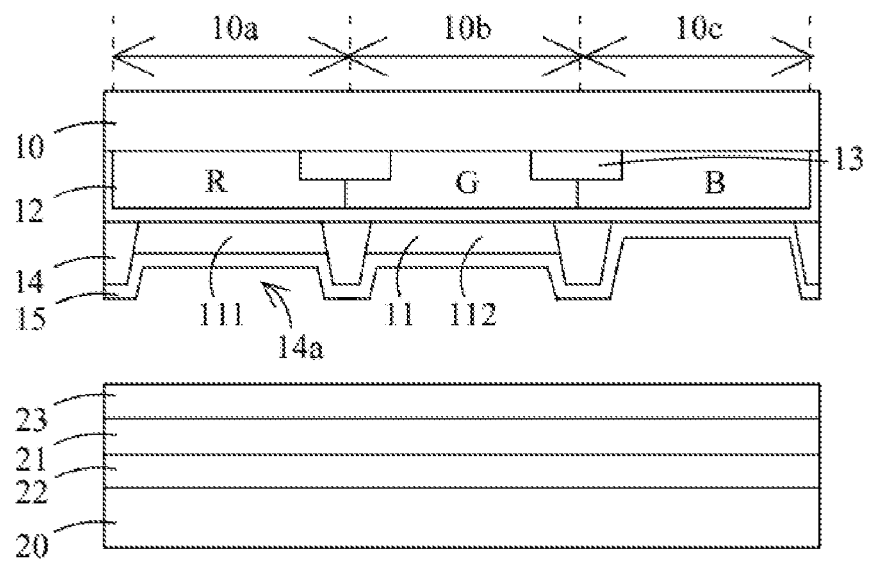
FIG. 1 is a schematic view of a display panel according to an embodiment of the present disclosure.

Referring to FIG. 1, it is a schematic view of a display panel according to an embodiment of the present disclosure. The display panel 100 includes a first substrate 10, a second substrate 20, a blue light emitting layer 21, a single crystal perovskite color conversion layer 11, a color filter layer 12, a black matrix layer 13, a pixel definition layer 14, a thin film transistor layer 22, and an encapsulation layer 15. The first substrate 10 and the second substrate 20 are disposed opposite to each other.

The first substrate 10 is a glass substrate. The second substrate 20 is also a glass substrate.

The blue light emitting layer 21 is configured to emit blue light. The blue light emitting layer 21 is disposed on a surface of the second substrate 20 opposite to the first substrate 10. The blue light emitting layer 21 includes a plurality of blue light emitting units. The blue emitting unit includes at least one of a blue organic light emitting diode, a blue light emitting diode, a blue mini-LED, a blue micro-LED, and blue quantum dots.

Specifically, the blue light emitting layer 21 includes a plurality of blue organic light emitting diodes. Each of the blue organic light emitting diodes includes a cathode, an anode, and a blue organic light emitting layer disposed between the cathode and the anode. Materials for preparing the blue organic light emitting layer may be carbazole and its derivatives.

When the blue light emitting layer 21 includes the plurality of blue organic light emitting diodes, a film packing layer 23 is disposed on a surface of the blue light emitting layer 21 away from the second substrate 20. The film packing layer 23 is configured to protect the blue organic light emitting layer and active metal electrodes of the blue light emitting layer 21, so as to prevent the blue organic light emitting layer and the active metal electrodes from being corroded by oxygen or water vapor. The film packing layer 23 includes a first inorganic layer, a first organic layer, and a second inorganic layer. The first inorganic layer is formed on the surface of the blue light emitting layer 21 away from the second substrate 20, the first organic layer is formed on a surface of the first organic layer away from the blue light emitting layer 21, and the second inorganic layer is formed on a surface of the first organic layer away from the first inorganic layer. Materials for preparing the first inorganic layer and the second inorganic layer are selected from at least one of silicon nitride and silicon oxide. The first organic layer is made of polyacrylate or other organic materials.

The thin film transistor layer 22 is disposed between the blue light emitting layer 21 and the second substrate 20. The thin film transistor layer 22 includes a plurality of thin film transistors disposed in array. The thin film transistors are configured to control switching and brightness of the blue light emitting units.

The single crystal perovskite color conversion layer 11 is disposed on a surface of the first substrate 11 opposite to the second substrate 20. The first substrate 10 defines red subpixel areas 10*a*, green subpixel areas 10*b*, and blue subpixel areas 10*c* thereon, and the red subpixel areas 10*a*, green subpixel areas 10*b*, and blue subpixel areas 10*c* are arranged at intervals. The red subpixel area 10*a*, the green subpixel area 10*b*, and the blue subpixel area 10*c* are repeatedly set in order.

The single crystal perovskite color conversion layer 11 includes red light single crystal perovskite units 111 disposed on the red subpixel areas 10*a* and green light single crystal perovskite units 112 disposed on the green subpixel areas 10*b*. The red light single crystal perovskite units 111 receive blue light to emit red light, the green light single crystal perovskite units 112 receive blue light to emit green light, and blue light emitted by the blue light emitting layer 21 passes through the blue subpixel area 10*c*, so as to obtain color display.

In this embodiment, the red light single crystal perovskite unit 111 includes at least one of a single crystal of $CH_3NH_3Pb(Br/I)_3$ and a single crystal of $CsPb(Br/I)_3$. The green light single crystal perovskite unit includes at least one of a single crystal of $Cs_4PbBr_6$, a single crystal of $CsPbBr_3$, and a single crystal of $CH_3NH_3PbBr_3$. A particle diameter of the single crystal perovskite is 100 nm to 1 mm, for example, the particle diameters of the single crystal perovskites are 1000 nm, 500 nm, and 200 μm.

In this embodiment, the pixel definition layer 14 is defined on the surface of the first substrate 10 opposite to the second substrate 20. A plurality of openings 14*a* are defined in the pixel definition layer 14, and each of the openings 14*a* defines a subpixel area. A longitudinal section of the opening 14*a* is shaped as an inverted trapezoid. Three adjacent openings 14*a* respectively define as the red subpixel area 10*a*, the blue subpixel area 10*b*, and the green subpixel area 10*c*. The pixel definition layer 14 is a black organic photoresist layer to prevent light emitted from the single crystal perovskite color conversion layers in the adjacent subpixel areas upon excitation of blue light from crossover, and the black organic photoresist layer can absorb blue light that is not incident in the subpixel areas. A thickness of the pixel definition layer is 8 μm to 12 μm, for example, the thickness of the pixel definition layer is 10 μm. The red light single crystal perovskite units 111 are disposed in the openings 14*a* of the pixel definition layer 14 corresponding to the red subpixel areas 10*a*, and the green light single crystal perovskite units 112 are disposed in the openings 14*a* of the pixel definition layer 14 corresponding to the green subpixel areas 10*b*.

In this embodiment, the color filter layer 12 is disposed between the pixel definition layer 14 and the first substrate 10. The color filter layer 12 includes a plurality of filter units, the plurality of filter units includes red filter units R, green filter units G, and blue filter units B arranged at intervals. The red filter units R are disposed in the red subpixel area 10*a*, the green filter units G are disposed in the green subpixel area 10*b*, and the blue filter units B are disposed in the blue subpixel area 10*c*. The color filter layer 12 is used to absorb blue light that is not absorbed by the pixel definition layer 14, and on the other hand, the color filter layer 12 is used to prevent external ambient light from being directly incident on the single crystal perovskite color conversion layer 11 to excite the single crystal perovskite color conversion layer 11. The black matrix layer 13 includes a plurality of black matrixes arranged in array. The black matrixes are disposed between adjacent two filter units to prevent from cross color. A thickness of the black matrix is 1 μm to 2 μm In this embodiment, a barrier layer 16 is disposed between the pixel definition layer 14 and the color filter layer 12. The barrier layer 16 is used to block water and oxygen and prevent water and oxygen from corroding the single crystal perovskite color conversion layer 11. Materials for preparing the barrier layer is at least one selected from silicon nitride and silicon oxide.

In this embodiment, the encapsulation layer 15 covers the single crystal perovskite color conversion layer 11 and the pixel definition layer 14. The encapsulant layer 15 is used to improve adhesion of the single crystal perovskite color conversion layer 11 on the first substrate 10, and is used to achieve packaging of the single crystal perovskite color conversion layer 11. The encapsulant layer 15 may be obtained by inkjet printing a mixture of a UV curable adhesive and a solvent, removing the solvent, and then performing UV curing. The encapsulant layer 15 may also be obtained by coating and curing an ultraviolet curing adhesive.

After experimental tests, the color gamut of the display panel in this embodiment is about 120%.

Figure 2:
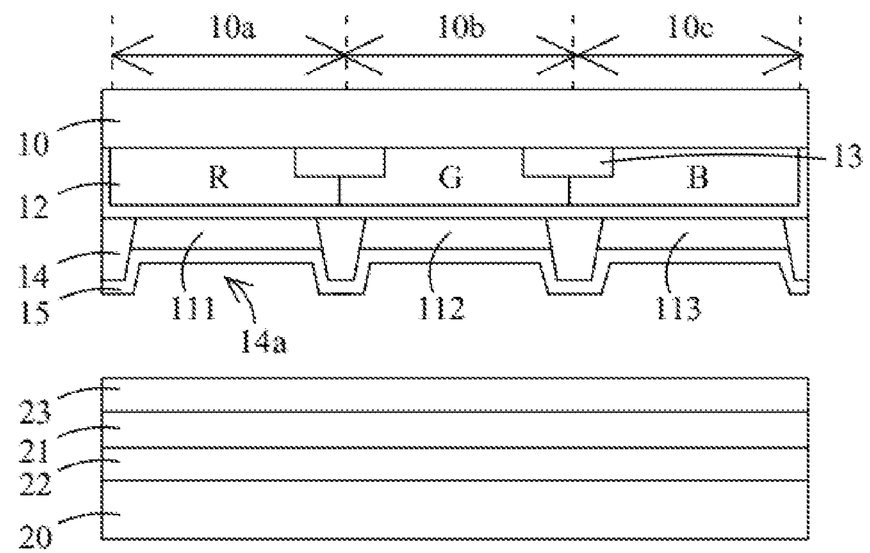
FIG. 2 is a schematic view of a display panel according to another embodiment of the present disclosure.

Referring to FIG. 2, it is a schematic view of a display panel according to another embodiment of the present disclosure. The display panel 100 shown in FIG. 2 is basically similar to the display panel 100 shown in FIG. 1, except that: the single crystal perovskite color conversion layer 11 further includes blue light single crystal perovskite units 113. The blue light single crystal perovskite units 113 receive blue light emitted by the blue light emitting layer 21 and are excited to emit blue light. Color purity of blue light emitted by the blue single crystal perovskite upon excitation is greater than or equal to color purity of blue light emitted by the blue light emitting layer, so as to improve the color purity of the blue light of the display panel. The blue light single crystal perovskite unit 113 includes at least one of a single crystal of $Cs_3Cu_2I_5$, a single crystal of $CH_3NH_3Pb(Br/Cl)_3$, and a single crystal of $CsPb(Br/Cl)_3$.

Referring to FIG. 3, it is a process diagram of a manufacturing method of a display panel according to an embodiment of the present disclosure. The manufacturing method of the display panel includes the following steps:

S10: forming a single crystal perovskite color conversion layer on a surface of a first substrate; wherein the single crystal perovskite color conversion layer is configured to receive blue light to emit at least red light and green light;

S11: superposing a surface of the second substrate where a blue light emitting layer is disposed to the surface of the first substrate where the single crystal perovskite color conversion layer is formed, so as to obtain a display panel.

In the manufacturing method of the display panel of the embodiment, the single crystal perovskite color conversion layer is formed on the first substrate, and the blue light emitting layer is disposed on the second substrate. Blue light emitted by the blue light emitting layer excites the single crystal perovskite color conversion layer to emit at least red light and green light. The red light and the green light emitted by the single crystal perovskite color conversion layer are together with the blue light emitted by the blue light emitting layer to realize color display, so as to improve the color gamut of the prepared display panel.

In this embodiment, the step of forming a single crystal perovskite color conversion layer on a surface of a first substrate includes the following steps:

adding perovskite precursor solution having a predetermined concentration to pixel grooves and heating the perovskite precursor solution until perovskite seed crystals are formed; wherein the first substrate is provided with the pixel grooves;

sequentially adding saturated perovskite precursor solution to the pixel grooves where the perovskite seed crystals are formed, heating and holding until single crystal perovskite appears, stopping heating and removing solvent in the perovskite precursor solution, so as to obtain a single crystal perovskite color conversion layer;

wherein the predetermined concentration is less than a concentration of the saturated perovskite precursor solution.

The perovskite precursor solution with the predetermined concentration is heated to form the perovskite seed crystals. The perovskite seed crystals are used as cores and the saturated perovskite precursor solution is added, the perovskite seed crystals are grown into large-sized single crystal perovskites by heating and holding, so that the prepared large-sized single crystal perovskites have fewer defects, and formation time of the large-sized single crystal perovskites is shortened.

In this embodiment, the perovskite precursor solution with the predetermined concentration and the saturated perovskite precursor solution are added to the pixel grooves by inkjet printing. Viscosities of the perovskite precursor solution with the predetermined concentration and the saturated perovskite precursor solution range from 1 cps to 30 cps. For example, the viscosity of the perovskite precursor solution with the predetermined concentration may be 5 cps, 8 cps, or 10 cps, and the viscosity of the saturated perovskite precursor solution may be 25 cps, 15 cps, or 18 cps. The viscosities of the perovskite precursor solution with the predetermined concentration and the saturated perovskite precursor solution are adjusted to meet process requirements for forming a single crystal perovskite color conversion layer by inkjet printing.

In this embodiment, the predetermined concentration ranges from 1.0 mol/L to 2.0 mol/L. The predetermined concentration ranges from 1.0 mol/L to 1.5 mol/L. The perovskite precursor solution with the predetermined concentration is a high-concentration perovskite precursor solution, which shortens formation time of the perovskite seed crystals and facilitates the formation of morphology of the perovskite seed crystals that are more suitable for the formation of large-sized perovskite seed crystals.

In this embodiment, a temperature for heating to form the perovskite seed crystals is 80° C.-100° C., and a temperature for heating and holding is 80° C.-100° C. Heating to form the perovskite seed crystals aims to grow the seed crystals at 80° C.-100° C. while removing the solvent by heating. The purpose of heating the saturated perovskite precursor solution is to allow the saturated perovskite precursor solution to precipitate single crystal perovskites under heating conditions, and the single crystal perovskites are grown with the perovskite seed crystal as cores. The purpose of holding the temperature of heating is to make single crystal perovskites grow into large-sized single crystal perovskites on the perovskite seed crystals.

Further, the temperature for heating to form the perovskite seed crystals is 8° C.-12° C. lower than the temperature for heating and holding. For example, when the temperature for heating to form the perovskite seed crystals is 85° C., the temperature for heating and holding is 95° C.

In the embodiment, the perovskite precursor solution includes component A, component B, and a solvent. The component A is selected from at least one of $PbBr_2$, $PbI_2$, and $PbCl_2$, the component B is selected from at least one of $CH_3NH_3Br$ and CsBr, and the solvent is selected from at least one of dimethylformamide and dimethyl sulfoxide.

The method for preparing the green light single crystal perovskite unit in the single crystal perovskite color conversion layer described above is described in detail with specific examples.

Embodiment 1

The embodiment provides a manufacturing method of the green light single crystal perovskite unit including the following steps:

Growing seed crystals. Wherein the perovskite precursor solution with the predetermined concentration is printed to the pixel grooves of the green subpixels of a base tab by inkjet printing, and it is heated at a temperature of 80° C. until precipitation occurs to obtain seed crystals. Wherein the perovskite precursor solution with the predetermined concentration includes 1 mol/L $PbBr_2$, 1 mol/L $CH_3NH_3Br$, and dimethylformamide. The viscosity of the perovskite precursor solution with the predetermined concentration is 5 cps.

Replenishing mother solution and growing large-sized single crystals. Wherein the saturated perovskite precursor solution (a viscosity of 10 cps, saturated solution obtained by dissolving $PbBr_2$ and $CH_3NH_3Br$ in dimethylformamide respectively) is sequentially added by inkjet printing to the pixel grooves of the green subpixels where the perovskite seeds are formed to supply raw materials required for the growth of large-sized single crystal perovskites, it is heated at a temperature of 90° C. for 10 h and is held at a temperature of 95° C. for 10 h, the heating is then stopped and the substrate is vacuum-decompressed (vacuum pressure is 10 mPa) to remove residual dimethylformamide, so as to obtain large-sized single crystals of $CH_3NH_3PbBr_3$.

Embodiment 2

The embodiment provides a manufacturing method of the green light single crystal perovskite unit including the following steps:

Growing seed crystals. Wherein the perovskite precursor solution with the predetermined concentration is printed to the pixel grooves of the green subpixels of a base tab by inkjet printing, and it is heated at a temperature of 90° C. until precipitation occurs to obtain seed crystals. Wherein the perovskite precursor solution with the predetermined concentration includes 1 mol/L $PbBr_2$, 1.5 mol/L CsBr, and dimethyl sulfoxide. The viscosity of the perovskite precursor solution with the predetermined concentration is 15 cps.

Replenishing mother solution and growing large-sized single crystals. Wherein the saturated perovskite precursor solution (a viscosity of 20 cps, saturated solution obtained by dissolving $PbBr_2$ and CsBr in dimethyl sulfoxide respectively) is sequentially added by inkjet printing to the pixel grooves of the green subpixels where the perovskite seeds are formed to supply raw materials required for the growth of large-sized single crystal perovskites, it is heated at a temperature of 100° C. for 10 h and is held at a temperature of 100° C. for 10 h, the heating is then stopped and the substrate is vacuum-decompressed (vacuum pressure is 5 mPa) to remove residual dimethyl sulfoxide, so as to obtain large-sized single crystals of $CsPbBr_3$.

It should be noted that the base tab in the embodiments 1 and 2 includes the first substrate, the color film layer disposed on the first substrate, the barrier layer disposed on a surface of the color film layer away from the first substrate, and the pixel definition layer disposed on a surface of the barrier layer away from the color film layer. A plurality of openings are defined in the pixel definition layer, and the plurality of openings include red subpixel grooves, blue subpixel grooves, and green subpixel grooves.

The descriptions of the above embodiments are only used to help understand the technical solutions of the present disclosure and their core ideas; those of ordinary skill in the art should understand that they can still modify the technical solutions described in the foregoing embodiments or equivalently replace some of the technologies features; and these modifications or replacements do not make the essence of the corresponding technical solution out of the scope of the technical solutions of the embodiments of the present disclosure.

What is claimed is:

1. A manufacturing method of a display panel, wherein the manufacturing method of the display panel comprises following steps:

forming a single crystal perovskite color conversion layer on a surface of a first substrate, wherein the single crystal perovskite color conversion layer is configured to receive blue light to emit at least red light and green light; and superposing a surface of a second substrate, where a blue light emitting layer is disposed, to the surface of the first substrate where the single crystal perovskite color conversion layer is formed, so as to obtain the display panel wherein the blue light emitting layer is configured to emit the blue light; and wherein the step of forming the single crystal perovskite color conversion layer on the surface of the first substrate comprises following steps:

adding perovskite precursor solution having a predetermined concentration to pixel grooves and heating the perovskite precursor solution until perovskite seed crystals are formed, wherein the first substrate is provided with the pixel grooves; and sequentially adding saturated perovskite precursor solution to the pixel grooves where the perovskite seed crystals are formed, heating and holding until single crystal perovskite appears, and stopping heating and removing solvent in the perovskite precursor solution, so as to obtain the single crystal perovskite color conversion layer;

wherein the predetermined concentration is less than a concentration of the saturated perovskite precursor solution.

2. The manufacturing method of the display panel as claimed in claim 1, wherein the perovskite precursor solution with the predetermined concentration and the saturated perovskite precursor solution are added to the pixel grooves by inkjet printing, viscosities of the perovskite precursor solution with the predetermined concentration and the saturated perovskite precursor solution range from 1 cps to 30 cps.

3. The manufacturing method of the display panel as claimed in claim 1, wherein the predetermined concentration ranges from 1.0 mol/L to 2.0 mol/L.

4. The manufacturing method of the display panel as claimed in claim 1, wherein a temperature for heating to form the perovskite seed crystals is 80° C.-100° C., and a temperature for heating and holding is 80° C.-100° C.

5. The manufacturing method of the display panel as claimed in claim 4, wherein the temperature for heating to form the perovskite seed crystals is 8° C.-12° C. lower than the temperature for heating and holding.

6. The manufacturing method of the display panel as claimed in claim 1, wherein the perovskite precursor solution comprises component A, component B, and a solvent, the component A is selected from at least one of $PbBr_2$, $PbI_2$, and $PbCl_2$, the component B is selected from at least one of $CH_3NH_3Br$ and CsBr, and the solvent is selected from at least one of dimethylformamide and dimethyl sulfoxide.

7. The manufacturing method of the display panel as claimed in claim 1, wherein the blue light emitting layer comprises a plurality of blue light emitting units, the blue emitting unit comprises at least one of a blue organic light emitting diode, a blue light emitting diode, a blue mini-LED, a blue micro-LED, and a blue quantum dot.

8. A display panel, comprises:

a first substrate defining red subpixel areas, green subpixel areas, and blue subpixel areas thereon;

a second substrate disposed opposite to the first substrate;

a blue light emitting layer disposed on a surface of the second substrate opposite to the first substrate, wherein the blue light emitting layer is configured to emit blue light; and a single crystal perovskite color conversion layer disposed on a surface of the first substrate opposite to the second substrate, wherein the single crystal perovskite color conversion layer comprises red light single crystal perovskite units disposed on the red subpixel areas, green light single crystal perovskite units disposed on the green subpixel areas, and blue light single crystal perovskite units disposed on the blue subpixel areas, the red light single crystal perovskite units are configured to receive the blue light to emit red light, the green light single crystal perovskite units are configured to receive the blue light to emit green light, the blue light single crystal perovskite units are configured to receive the blue light emitted by the blue light emitting layer and to excite to emit another blue light, and color purity of the blue light emitted by the blue single crystal perovskite upon excitation is greater than or equal to color purity of the blue light emitted by the blue light emitting layer.

9. The display panel as claimed in claim 8, wherein the red light single crystal perovskite unit comprises at least one of a single crystal of $CH_3NH_3Pb(Br/I)_3$ and a single crystal of $CsPb(Br/I)_3$, the green light single crystal perovskite unit comprises at least one of a single crystal of $Cs_4PbBr_6$, a single crystal of $CsPbBr_3$, and a single crystal of $CH_3NH_3PbBr_3$, and the blue light single crystal perovskite unit comprises at least one of a single crystal of $Cs_3Cu_2I_5$, a single crystal of $CH_3NH_3Pb(Br/Cl)_3$, and a single crystal of $CsPb(Br/Cl)_3$.

10. The display panel as claimed in claim 8, wherein a pixel definition layer is disposed on the surface of the first substrate opposite to the second substrate, a plurality of openings are defined in the pixel definition layer, and each of the openings defines a subpixel area; three adjacent openings respectively define as the red subpixel area, the blue subpixel area, and the green subpixel area; the red light single crystal perovskite units are disposed in the openings of the pixel definition layer corresponding to the red subpixel areas, and the green light single crystal perovskite units are disposed in the openings of the pixel definition layer corresponding to the green subpixel areas.

11. The display panel as claimed in claim 10, wherein the pixel definition layer is a black organic photoresist layer.

12. The display panel as claimed in claim 10, wherein the display panel further comprises a color filter layer and a black matrix layer; the color filter layer is disposed between the pixel definition layer and the first substrate, the color filter layer comprises a plurality of filter units, the plurality of filter units comprises red filter units, green filter units, and blue filter units arranged at intervals; the black matrix layer comprises a plurality of black matrixes arranged in array, and there is a black matrix disposed between two adjacent filter units.

13. The display panel as claimed in claim 12, wherein a barrier layer is disposed between the pixel definition layer and the color filter layer, and the barrier layer is configured to block water and oxygen.

14. The display panel as claimed in claim 8, wherein the blue light emitting layer comprises a plurality of blue light emitting units, the blue emitting unit comprises at least one of a blue organic light emitting diode, a blue light emitting diode, a blue mini-LED, a blue micro-LED, and a blue quantum dot.

15. A display panel, comprises:

a first substrate defining red subpixel areas, green subpixel areas, and blue subpixel areas thereon;

a second substrate disposed opposite to the first substrate;

a pixel definition layer disposed on a surface of the first substrate opposite to the second substrate;

a blue light emitting layer disposed on a surface of the second substrate opposite to the first substrate, wherein the blue light emitting layer is configured to emit blue light; and a single crystal perovskite color conversion layer disposed on a surface of the first substrate opposite to the second substrate, wherein the single crystal perovskite color conversion layer comprises red light single crystal perovskite units disposed on the red subpixel areas and green light single crystal perovskite units disposed on the green subpixel areas, the red light single crystal perovskite units receive the blue light to emit red light, the green light single crystal perovskite units receive the blue light to emit green light; and wherein a plurality of openings are defined in the pixel definition layer, and each of the openings defines a subpixel area; three adjacent openings respectively define as the red subpixel area, the blue subpixel area, and the green subpixel area; the red light single crystal perovskite units are disposed in the openings of the pixel definition layer corresponding to the red subpixel areas and are in contact with the pixel definition layer directly, and the green light single crystal perovskite units are disposed in the openings of the pixel definition layer corresponding to the green subpixel areas and are in contact with the pixel definition layer directly.

16. The display panel as claimed in claim 15, wherein the pixel definition layer is a black organic photoresist layer.

17. The display panel as claimed in claim 16, wherein the display panel further comprises a color filter layer disposed between the pixel definition layer and the first substrate, and the color filter layer is configured to absorb blue light that is not absorbed by the pixel definition layer and to prevent external ambient light from being directly incident on the single crystal perovskite color conversion layer.

18. The display panel as claimed in claim 17, wherein the display panel further comprises a black matrix layer, the black matrix layer comprises a plurality of black matrixes arranged in array, the color filter layer comprises a plurality of filter units, and the black matrixes are disposed between adjacent two ones of the filter units.

* * * * *